(12) United States Patent
Tziony et al.

(10) Patent No.: US 6,711,215 B1
(45) Date of Patent: Mar. 23, 2004

(54) ELECTRICAL CIRCUIT FOR CROSSTALK REDUCTION

(75) Inventors: Noam Tziony, Bnei-Brak (IL); Moti Itzkovitch, Petach Tikva (IL); Netzer Moriya, Ramat Hasharon (IL)

(73) Assignee: Netmor LTD, Ramar Hasharon (IL)

( * ) Notice: Subject to any disclaimer, the term of this patent is extended or adjusted under 35 U.S.C. 154(b) by 0 days.

(21) Appl. No.: 09/576,587

(22) Filed: May 22, 2000

(51) Int. Cl.[7] ............................ H04B 3/32; H04L 25/00
(52) U.S. Cl. ........................................ 375/285; 375/257
(58) Field of Search ............................................ 375/285

(56) References Cited

U.S. PATENT DOCUMENTS

| | | | |
|---|---|---|---|
| 4,314,251 A | 2/1982 | Raab | 343/112 R |
| 4,742,356 A | 5/1988 | Kuipers | 342/448 |
| 4,849,692 A | 7/1989 | Blood | 324/208 |
| 5,646,525 A | 7/1997 | Gilboa | 324/207.17 |
| 5,887,032 A | * 3/1999 | Cioffi | 375/257 |
| 6,337,602 B2 | * 1/2002 | Hilliard et al. | 331/65 |

* cited by examiner

*Primary Examiner*—Stephen Chin
*Assistant Examiner*—Lawrence Williams
(74) *Attorney, Agent, or Firm*—Fitch, Even, Tabin & Flannery

(57) ABSTRACT

A method for reducing a current crosstalk interference component from an oscillating multiplex electric current flowing through a magnetic coil of a given electrical circuit originated from an electromagnetic flux emanating from a magnetic coil of a certain neighboring electrical circuit and intercepted by the magnetic coil of the given electrical circuit. The oscillating multiplex electric current has a main current component, related to the given electrical circuit, which is superposed with the current crosstalk interference component. The reduction of the crosstalk interference is achieved by estimating the current crosstalk interference component induced by the certain neighboring electrical circuit, and subtracting this current crosstalk interference component from a multiplex electric current flowing through the magnetic coil of the given electrical circuit by using earlier obtained crosstalk interference estimates.

10 Claims, 1 Drawing Sheet

ELECTRICAL CIRCUIT FOR CROSSTALK REDUCTION

FIELD OF THE INVENTION

This invention relates to electro-magnetic field transmission systems and more particularly, to reduction of crosstalk interference components due to mutual coupling in magnetic coils.

BACKGROUND OF THE INVENTION

A problem may arise in electronics due to the mutual inductance when two or more electrical circuits having magnetic coils generating electromagnetic field are disposed relatively close one with respect to the other. Indeed, when oscillating electric currents in these coils are of high intensity, interference (hereafter referred to as crosstalk interference) may arise due to electromagnetic coupling between the magnetic coils. For instance, if a portion of the oscillating electromagnetic flux emanating from a magnetic coil of one electrical circuit intercepts a coil of an adjacent electrical circuit, then such stray flux from the first coil may cause undesirable crosstalk oscillating current in the second coil and vice versa. The frequency of this undesirable current in the second coil is equal to the frequency of the inducing electromagnetic flux in the first coil.

The problem of crosstalk interference may be even reinforced when resonance circuits, including a capacitor coupled with a coil, are used instead of a single coil. This may result in reducing the signal-to-noise ratio, and thereby will cause undesirable distortion of signals in the electrical circuits.

There is, accordingly, a need in the art to provide a technique for reducing components of the crosstalk interference in electrical circuits that include magnetic coils which are disposed relatively close one with respect to other.

SUMMARY OF THE INVENTION

In accordance with the invention, the reduction of the crosstalk interference is achieved by estimating the current crosstalk interference induced by certain neighboring coils into the given circuit; and, thereafter, by subtracting this crosstalk interference components from a multiplex electric current flowing through the magnetic coil of the given electrical circuit.

The invention, for instance, may be useful for electromagnetic multi-carrier transmissions wherein the electrical circuits are electromagnetic transmitters and crosstalk interference can be a substantial impediment to proper transmission of a signal. Such multi-carrier transmissions, for instance, may be utilized for the purpose of determining position and orientation of a moving object (see, for example, U.S. Pat. Nos. 4,314,251, 4,742,356, 4,849,692, 5,646,525 and the references thereof).

In accordance with a general aspect of the invention there is provided a system comprising at least two electric circuits, each electrical circuit having a magnetic coil with an oscillating multiplex electric current flowing therethrough; said oscillating multiplex electric current having a main current component, related to a given electrical circuit from among said at least two electric circuits, which is superposed with a current crosstalk interference component, originated from electromagnetic flux emanating from the magnetic coil of an at least one neighboring electrical circuit from among said at least two electric circuits and intercepted by the magnetic coil of the given electrical circuit, wherein each of said electrical circuits is configured to perform the following:

(a) estimating the crosstalk interference component induced by the at least one neighboring electrical circuit; and (b) subtracting the crosstalk interference component from the current flowing through the magnetic coil of the given electrical circuit by using the crosstalk interference estimates obtained in (a);

whereby reduction of said current crosstalk interference component is achieved.

In accordance with a preferred embodiment of the invention, each of said electrical circuit comprising:

(i) an analog module incorporating a magnetic coil; and (ii) a digital module coupled to said analog module via a digital-to-analogue converter and via an analog-to-digital converter, thereby forming a closed loop electric circuit; said digital module is configured to reduce said current crosstalk interference components.

In accordance with the invention, the digital module comprising an at least one Crosstalk Frequency Reduction Control Loop (CFRCL) for receiving said multiplex electric current from said analog-to-digital converter and providing a corrected signal to said analog module via the digital-to-analog converter for reducing the corresponding crosstalk interference component originated from the magnetic coil of the certain neighboring electrical circuit, said CFRCL comprising: a Phase Locked Loop unit coupled with said analog-to-digital converter; an All Pass Filter coupled with said digital-to-analog converter, and a Main Frequency Controller coupled with said Phase Locked Loop unit and said All Pass Filter.

In accordance with the invention, the digital module further comprising a Main Frequency Control Loop (MFCL) for receiving a multiplex electric current from the analog-to-digital converter, wherein the MFCL stabilizes a main current component of said multiplex electric current, related to the given electrical circuit, and provides a stabilized main current component to said analog module via the digital-to-analog converter, the MFCL comprising: a Phase Locked Loop unit coupled with said analog-to-digital converter, an All Pass Filter coupled with said digital-to-analog converter, and a Main Frequency Controller coupled with said Phase Locked Loop unit and said All Pass Filter.

In accordance with another general aspect of the present invention, there is provided a method for reducing a current crosstalk interference component from an oscillating multiplex electric current flowing through a magnetic coil of a given electrical circuit, oscillating multiplex electric current having a main current component, related to the given electrical circuit, which is superposed with said current crosstalk interference component originated from an electromagnetic flux emanating from a magnetic coil of a certain neighboring electrical circuit and intercepted by the magnetic coil of the given electrical circuit, the method comprising the steps of:

(a) estimating said current crosstalk interference component induced by the certain neighboring electrical circuit; and (b) subtracting said current crosstalk interference component from a multiplex electric current flowing through the magnetic coil of the given electrical circuit by using crosstalk interference estimates obtained in step (a).

BRIEF DESCRIPTION OF THE DRAWING

The presented invention will be more fully understood hereinafter from the following detailed description of preferred embodiments when taken in conjunction with the sole drawing, in which a schematic diagram of an electrical circuit with crosstalk reducing module is shown in accordance with the present invention.

DETAILED DESCRIPTION OF PREFERRED EMBODIMENT

Figure 1:
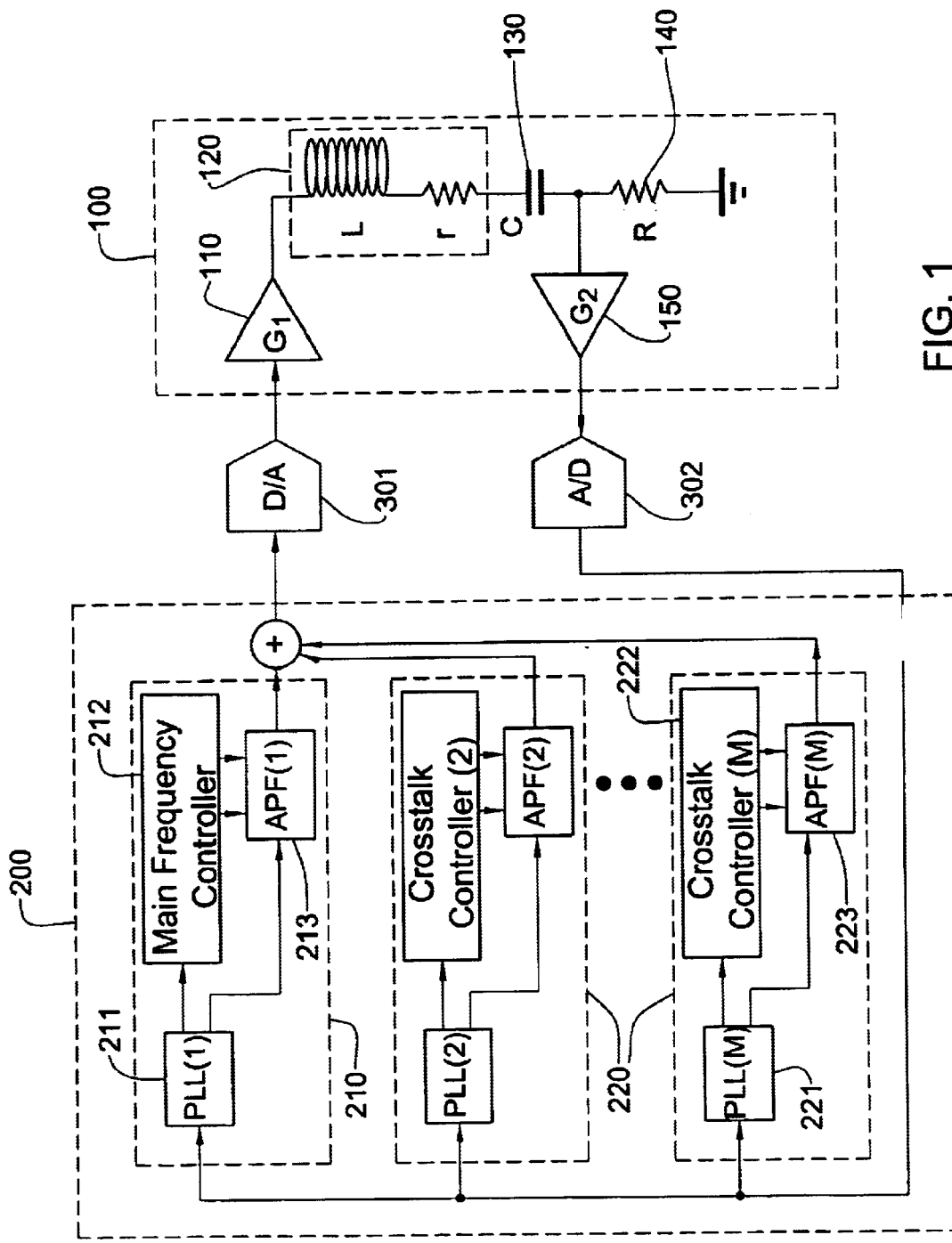

Reference will now be made in detail to the description of a preferred embodiment of the invention. Those versed in the art will readily appreciate that the invention is not limited in its application to the details of construction and to the arrangements of the components set forth in the following description or illustrated in the drawings. The invention is intended to embrace alternatives, modifications and equivalents and may be realized in various other ways. Moreover, the nomenclature and terminology that is being used in the description should not be regarded as limiting.

Referring now to the FIGURE, there is shown a schematic diagram of the electrical circuit in accordance with the present invention that, in general, includes an analog module 100 emanating an electromagnetic field with predetermined power and frequency and a digital crosstalk reduction module 200. The modules are coupled to each other via a digital-to-analogue converter (DAC) 301 and an analog-to-digital converter (ADC) 302. The role of DAC 301 is to convert the digital signal that is fed from the digital module into analog signal, and the role of ADC 302 is to convert the analog signal that is fed from the analog module into digital signal. These roles are known per se to a man of the art and, therefore, are not further expounded upon herein.

According to preferred embodiment, the analog module incorporates a Power Voltage Amplifier 110 coupled at the output thereof to a magnetic coil 120 (having an inductance L and a resistance r), a Resonance Serial Capacitor 130 (having a capacitance C) coupled to a sampling resistor 140 (having a resistance R) and said magnetic coil, and a Low Noise Preamplifier 150 coupled to said sampling resistor and said Resonance Serial Capacitor.

According to another embodiment. Resonance Serial Capacitor 130 may not be included in analog module 100. In such case, magnetic coil 120 should be directly coupled to sampling resistor 140 and to Low Noise Preamplifier 150.

Power Voltage Amplifier 110 provides a voltage gain $G_1$, and is utilized for amplification of an input signal to a desired level.

As it will be clear to a man of the art, a series resonant circuit of the preferred embodiment, that is constituted by Resonance Serial Capacitor 140 and magnetic coil 120, serves as a basic bandpass filter for reducing the required output voltage of Power Voltage Amplifier 110. Indeed, in the case of a resonance, the current flowing through the circuit is high, and although large voltages are developed across the individual elements these are out of phase with each other, so that the total voltage developed across the circuit is relatively low.

Sampling resistor 140 is used for sampling a current passing across the magnetic coil. Resistor 140 is chosen to be relatively small. Such a value should provide with the potential difference across the resistor to be relatively small with respect to the output voltage of Power Voltage Amplifier 110.

The signal obtained on sampling resistor 140 is fed into Low Noise Preamplifier 150, which provides a voltage gain of $G_2$. The role of Preamplifier 150 is to buffer the input of ADC 302 from the potential difference across resistor 140.

In the present embodiment, Power Voltage Amplifier 110 and Low Noise Preamplifier 150 as well as DAC and ADC converters 301 and 302 are known per se and may be of any conventional type. For the transmitters radiating quasistatic electromagnetic field in the range of 100 Hz–100 kHz, for example, the following typical range of values of the electrical elements of the analog module may be selected: L=1 mH–1 H; r=1Ω–100Ω; C=1 nF–1 μF; R=0.1Ω–10Ω; $G_1$=1–10; and $G_2$=1–10.

Digital crosstalk reduction module 200 incorporates a Main Frequency Control Loop (MFCL) 210 and a plurality of Crosstalk Frequency Reduction Control Loops (CFRCL) 220 coupled to analog-to-digital converter 302 for receiving a multiplex signal that consists of a main frequency signal combined with crosstalk interference components. In operation, MFCL 210 stabilizes the main frequency and phase of the signal, which is associated with the given coil, i.e. MFCL 210 corrects the signal by controlling its phase, frequency and amplitude, and compensating for their small fluctuations. Thereafter it provides the corrected signal to digital-to-analog converter 301.

On the other hand, each CFRCL 220 provides a corrected signal to analog module 100 via digital-to-analog converter 301 for reducing the crosstalk interference component originated from a coil of a respective neighboring electric circuits. In a multi-coil environment, a single CFRCL would preferably be implemented for each neighboring coil.

By this particular embodiment, MFCL 210 includes a Phase Locked Loop (PLL) unit 211, a Main Frequency Controller 212, and an All Pass Filter (APF) 213. Respectively, each of CFRCLs 220 includes a Phase Locked Loop unit 221, a Crosstalk Frequency Controller 222, and an All Pass Filter (APF) 223.

PLL unit 211 of MFCL 210 is tuned and locked on the main frequency signal of the given coil. Accordingly, in the case of a multi-circuit environment, PLL unit 211 of each corresponding circuit controls the phase and amplitude of the sampled signal obtained from the corresponding ADC 302, and compensates for small fluctuations of the main frequency associated with the corresponding coil.

Turning now to PLL unit 221, each of these units of the given circuit is tuned and locked on a single crosstalk interference component induced by one of the neighboring coils, each coil belongs to the corresponding neighboring circuit.

Note, that such a phase locked loop technique is known per se. According to the present-invention, preferably although not necessarily, to utilized a digital PLL technique of the kind. disclosed in the co-pending and co-owned Israeli Patent Application No. 132161 filed on Sep. 20, 1999 and corresponding U.S. patent application Ser. No. 09/575,517, the disclosure of which is hereby incorporated by reference.

Reverting now to PLL 211, it provides an output which is an amplitude, related to the current across magnetic coil 120 corresponding to the main frequency that is applied to Main Frequency Controller 212, and a sine wave related to this current that is applied to APF 213. The Main Frequency Controller controls and stabilizes this amplitude. In turn, APF 213 receives the sine wave output from PLL 211 and the amplitude magnitude from Main Frequency Controller 212. The APF scales the sine wave and shifts the phase of the wave to predetermined magnitudes and provides the output signal to the DAC 301, all as known per se.

On the other hand, each PLL unit 221 of CFRCLs 220 provides estimates of amplitude of the corresponding crosstalk interference component to the corresponding Crosstalk Controller 222 and a sine wave of the corresponding interference crosstalk component to corresponding APF 223. Each Crosstalk Controller 222 of CFRCLs 220 controls, corrects and stabilizes the corresponding amplitude and provides it to corresponding All Pass Filter 223. Each All Pass Filter of CFRCLs 220 receives the corresponding amplitude and the sine-wave from corresponding PLL unit 221 and provides a corresponding scaled and shifted sine wave. These waves from all CFRCLs 220 are supplied to analog unit 100 via DAC 301 for subtraction each corresponding interference crosstalk component from the multiplex signal, and thereby reducing the crosstalk interference component in the field radiated by the given coil.

According to the invention the Main Frequency Controller module, preferably, is a Proportional-Integral controller and the crosstalk controller module, preferably, is an adaptive controller. Operation of both these controllers is known per se to a man of the art, and, therefore, is not expounded upon hereto.

An analog module having a coil with the parameters of electrical elements and the digital module as described above is expected to provide a stable signal with reduced crosstalk interference components that will be sufficient for each PLL unit 221 to be locked an a corresponding crosstalk interference signal.

A non-limiting example of utilization of the present invention is a crosstalk reduction in an electromagnetic multi-carrier transmission environment. The systems based on this concept, typically, may include a plurality of transmitters generating electromagnetic fields and a magnetometer that may be any transducer.

In such case the electrical circuit of the present invention is a part of the electromagnetic transmitter and the coil of the present invention is a part of an antenna of the transmitter. The transducer is capable of producing an output that is, for example, an analog electric signal proportional to superposition of the received electromagnetic fields. There are known in the art various techniques, in which the output of the transducer can be processed to produce data indicative of moving transducer position and orientation. However, when a transmitting electromagnetic signal is of high intensity, or the transmitters generating electromagnetic field located relatively close one to the other, crosstalk interference may arise due to electromagnetic interaction between the coils of different transmitters generating electromagnetic field. Such crosstalk interference can be a substantial impediment to proper determination of the transducer position and orientation, and therefore, may be reduced by utilizing a technique of this invention.

The present invention has been described with a certain degree of particularity, but various alterations and modifications may be carried out without departing from the scope of the following claims.

What is claimed is:

1. A system comprising at least two electrical circuits, each electrical circuit having a magnetic coil with an oscillating multiplex electric current flowing therethrough; said oscillating multiplex electrical current having a main current component, related to a given electrical circuit from among said at least two electrical circuits, which is superposed with a current crosstalk interference component, originated from electromagnetic flux emanating from the magnetic coil of at least one neighboring electrical circuit from among said at least two electrical circuits and intercepted by the magnetic coil of the given electrical circuit, wherein each of said electrical circuits is configured to perform the following:
   estimating the crosstalk interference component induced by the at least one neighboring electrical circuit; and
   subtracting the crosstalk interference component from the current flowing through the magnetic coil of the given electrical circuit by using the crosstalk interference estimates obtained in said estimating of the crosstalk interference;
wherein each of said electrical circuit comprising:
   (i) an analog module incorporating a magnetic coil; and
   (ii) a digital module coupled to said analog module via a digital-to-analogue converter and via an analog-to-digital converter, thereby forming a closed electrical circuit; said digital module is configured to reduce said current crosstalk interference component;
wherein said analog module comprising:
   (a) a Power Voltage Amplifier,
   (b) a magnetic coil coupled to said Power Voltage Amplifier for amplifying an oscillating output electric current of said analog-to-digital converter flowing across the coil,
   (c) a sampling resistor coupled to said magnetic coil for sampling the current flowing across the coil, and
   (d) a Low Noise Preamplifier coupled to said sampling resistor for pre-amplification an electric current obtained on the sampling resistor.

2. The system of claim 1 further comprising a Resonance Serial Capacitor coupled to said magnetic coil and forming with the coil a series resonant circuit.

3. A system comprising at least two electrical circuits, each electrical circuit having a magnetic coil with an oscillating multiplex electric current flowing therethrough; said oscillating multiplex electrical current having a main current component, related to a given electrical circuit from among said at least two electrical circuits, which is superposed with a current crosstalk interference component, originated from electromagnetic flux emanating from the magnetic coil of at least one neighboring electrical circuit from among said at least two electrical circuits and intercepted by the magnetic coil of the given electrical circuit, wherein each of said electrical circuits is configured to perform the following:
   (A) estimating the crosstalk interference component induced by the at least one neighboring electrical circuit; and
   (B) subtracting the crosstalk interference component from the current flowing through the magnetic coil of the given electrical circuit by using the crosstalk interference estimates obtained in said estimating of the crosstalk interference;
wherein said electrical circuit is configured to estimate said current crosstalk interference component, as stipulated in (A), by receiving a multiplex electric current flowing through the magnetic coil of the given electrical circuit comprising a main current component having a frequency related to the given electric circuit combined with said current crosstalk interference component; receiving by a Crosstalk Frequency Reduction Control Loop (CFRCL); and
providing a corrected signal to an analog module of the given electrical circuit for subtracting the corresponding said current crosstalk interference component of the certain neighboring electrical circuit from said multiplex electric current;
wherein each of said electrical circuit comprising:
   (i) an analog module incorporating a magnetic coil; and
   (ii) a digital module coupled to said analog module via a digital-to-analogue converter and via an analog-to-digital converter, thereby forming a closed electrical circuit; said digital module is configured to reduce said current crosstalk interference component; and wherein said digital module comprising at least one CFRCL for receiving said multiplex electric current from said analog-to-digital converter and providing a corrected signal to said analog module via the digital-to-analog converter for reducing the corresponding crosstalk interference component originated from magnetic coil of the certain neighboring electrical circuit, said CFRCL comprising:
  (a) a Phase Locked Loop unit coupled with said analog-to-digital converter;
  (b) an All Pass Filter coupled with said digital-to-analog converter, and
  (c) a Main Frequency Controller coupled with said Phase Locked Loop unit and said All Pass Filter.

4. The system of claim 3 further comprising a Main Frequency Control Loop (MFCL) for receiving said multiplex electric current from the analog-to-digital converter, wherein the MFCL stabilizes a main current component of said multiplex electric current, related to the given electrical circuit, and provides a stabilized main current component to said analog module via the digital-to-analog converter, the MFCL comprising:
  a Phase Locked Loop unit coupled with said analog-to-digital converter,
  an All Pass Filter coupled with said digital-to-analog converter, and
  a Main Frequency Controller coupled with said Phase Locked Loop unit and said All Pass Filter.

5. A method for reducing a current crosstalk interference component from an oscillating multiplex electric current flowing through a magnetic coil of a given electrical circuit, the oscillating multiplex electric current having a main current component, related to the given electrical circuit, which is superposed with said current crosstalk interference component originated from an electromagnetic flux emanating from a magnetic coil of a certain neighboring electrical circuit and intercepted by the magnetic coil of the given electrical circuit, the method comprising the steps of:
  (A) estimating said current crosstalk interference component induced by the certain neighboring electrical circuit; and
  (B) subtracting said current crosstalk interference component from a multiplex electric current flowing through the magnetic coil of the given electrical circuit by using crosstalk interference estimate obtained in step (A);
  wherein step (A) comprises:
    (a) receiving said multiplex electric current flowing through the magnetic coil of the given electrical circuit comprising a main current component having a frequency related to the given electrical circuit combined with said current crosstalk interference component; receiving by a Crosstalk Frequency Reduction Control Loop; and
    (b) providing a corrected signal to an analog module of the given electrical circuit for subtracting the corresponding said current crosstalk interference component of the certain neighboring electrical circuit from said multiplex electric current.

6. The method of claim 5 wherein frequency of the oscillating electric current is within the range of about 1 Hz to 10 MHz.

7. A system comprising at least two electrical circuits, each electrical circuit having a magnetic coil with an oscillating multiplex electric current flowing therethrough; said oscillating multiplex electrical current having a main current component, related to a given electrical circuit from among said at least two electrical circuits, which is superposed with a current crosstalk interference component, originated from electromagnetic flux emanating from the magnetic coil of at least one neighboring electrical circuit from among said at least two electrical circuits and intercepted by the magnetic coil of the given electrical circuit, wherein each of said electrical circuits is configured to perform the following:
  estimating the crosstalk interference component induced by the at least one neighboring electrical circuit; and
  subtracting the crosstalk interference component from the current flowing through the magnetic coil of the given electrical circuit by using the crosstalk interference estimates obtained in said estimating of the crosstalk interference;
wherein each of said electrical circuit comprising:
  (i) an analog module incorporating a magnetic coil; and
  (ii) a digital module coupled to said analog module via a digital-to-analogue converter and via an analog-to-digital converter, thereby forming a closed electrical circuit; said digital module is configured to reduce said current crosstalk interference component;
wherein said analog module comprising:
  (a) a Power Voltage Amplifier,
  (b) a magnetic coil coupled to said Power Voltage Amplifier for amplifying an oscillating output electric current of said analog-to-digital converter flowing across the coil,
  (c) a sampling resistor coupled to said magnetic coil for sampling the current flowing across the coil, and
  (d) a Low Noise Preamplifier coupled to said sampling resistor for pre-amplification an electric current obtained on the sampling resistor.

8. The system of claim 7 further comprising a Resonance Serial Capacitor coupled to said magnetic coil and forming with the coil a series resonant circuit.

9. A system comprising at least two electrical circuits, each electrical circuit having a magnetic coil with an oscillating multiplex electric current flowing therethrough; said oscillating multiplex electrical current having a main current component, related to a given electrical circuit from among said at least two electrical circuits, which is superposed with a current crosstalk interference component, originated from electromagnetic flux emanating from the magnetic coil of at least one neighboring electrical circuit from among said at least two electrical circuits and intercepted by the magnetic coil of the given electrical circuit, wherein each of said electrical circuits is configured to perform the following:
  estimating the crosstalk interference component induced by the at least one neighboring electrical circuit; and
  subtracting the crosstalk interference component from the current flowing through the magnetic coil of the given electrical circuit by using the crosstalk interference estimates obtained in said estimating of the crosstalk interference;
wherein each of said electrical circuit comprising:
  (i) an analog module incorporating a magnetic coil; and
  (ii) a digital module coupled to said analog module via a digital-to-analogue converter and via an analog-to-digital converter, thereby forming a closed electrical circuit; said digital module is configured to reduce said current crosstalk interference component;
wherein said digital module comprising at least one Crosstalk Frequency Reduction Control Loop (CFRCL) for receiving said multiplex electric current from said analog-to-digital converter and providing a corrected signal to said analog module via the digital-to-analog converter for reducing the corresponding crosstalk interference component originated from the coil of the certain neighboring electrical circuit, said CFRCL comprising:

(a) a Phase Locked Loop unit coupled with said analog-to-digital converter;
(b) an All Pass Filter coupled with said digital-to-analog converter; and
(c) a Crosstalk Controller coupled with said Phase Locked Loop unit and said All Pass Filter.

10. The system of claim 9 wherein said digital module further comprising a Main Frequency Control Loop (MFCL) for receiving a multiplex electric current from the analog-to-digital converter, wherein the MFCL stabilizes a main current component of said multiplex electric current, related to the given electrical circuit, and provides a stabilized main current component to said analog module via the digital-to-analog converter, the MFCL comprising:

(i) a Phase Locked Loop unit coupled with said analog-to-digital converter,
(ii) an All Pass Filter coupled with said digital-to-analog converter, and
(iii) a Main Frequency Controller coupled with said Phase Locked Loop unit and said All Pass Filter.

* * * * *